United States Patent
Chen et al.

(10) Patent No.: US 8,008,692 B2
(45) Date of Patent: Aug. 30, 2011

(54) SEMICONDUCTOR MEMORY STRUCTURE WITH STRESS REGIONS

(75) Inventors: Hung-Wei Chen, Hsin-Chu (TW); Yider Wu, Hsin-Chu (TW)

(73) Assignee: EON Silicon Solution Inc., Hsin-Chu (TW)

( * ) Notice: Subject to any disclaimer, the term of this patent is extended or adjusted under 35 U.S.C. 154(b) by 255 days.

(21) Appl. No.: 12/233,486

(22) Filed: Sep. 18, 2008

(65) Prior Publication Data
US 2010/0065893 A1    Mar. 18, 2010

(51) Int. Cl.
*H01L 29/04* (2006.01)
(52) U.S. Cl. .................. 257/255; 257/E29.004
(58) Field of Classification Search .......... 257/632, 257/E20.004
See application file for complete search history.

(56) References Cited

U.S. PATENT DOCUMENTS

| | | | |
|---|---|---|---|
| 2008/0230845 A1* | 9/2008 | Okonogi et al. | 257/382 |
| 2009/0032844 A1* | 2/2009 | Ogura et al. | 257/190 |
| 2009/0079008 A1* | 3/2009 | Nandakumar et al. | 257/377 |
| 2009/0294986 A1* | 12/2009 | Yan et al. | 257/774 |

* cited by examiner

*Primary Examiner* — Thao P. Le
(74) *Attorney, Agent, or Firm* — Schmeiser, Olsen & Watts LLP

(57) ABSTRACT

A semiconductor memory structure with stress regions includes a substrate defining a first and a second device zone; a first and a second stress region formed in each of the first and second device zone to yield stress different in level; a barrier plug separating the two device zones from each other; and a plurality of oxide spacers being located between the first stress regions and the barrier plug while in direct contact with the first stress regions. Due to the stress yielded at the stress regions, increased carrier mobility and accordingly, increased reading current can be obtained, and only a relatively lower reading voltage is needed to obtain an initially required reading current. As a result, the probability of stress-induced leakage current is reduced to enhance the data retention ability.

17 Claims, 4 Drawing Sheets

SEMICONDUCTOR MEMORY STRUCTURE WITH STRESS REGIONS

FIELD OF THE INVENTION

The present invention relates to a semiconductor memory structure, and more particularly, to a semiconductor memory structure with stress regions.

BACKGROUND OF THE INVENTION

Following the advancement in scientific technologies, the process technique for flash memory has also moved into the nano era. To enable increased device operating speed, high integration density of a device, reduced the device operating voltage, etc., it has become an inevitable trend to minimize the gate channel length and the oxide layer thickness of the semiconductor device. The measure of gate line width has been reduced from the past micrometer ($10^{-6}$ meter) to the current nanometer ($10^{-9}$ meter). However, the device size reduction also brings many problems, such as stress-induced leakage current (SILC) and worsened short channel effect due to reduced gate line width. To avoid the device from being adversely affected by the short channel effect, the oxide layer thereof must have a thickness as small as possible. However, when the oxide layer has a thickness of 8 nm or below, the physical limit of material thereof would become a barrier in the manufacturing process of the device. By the SILC, it means an increased leakage current at the gate of a device after a constant voltage stress or a constant current stress is applied to the device. When the oxide layer is reduced in its thickness, the SILC becomes a very important issue. Increase of the SILC would lead to loss of electrons retained in the floating gate and accordingly, largely lowered data retention ability and increased power consumption of the metal-oxide-semiconductor (MOS) device. Further, the gate disturb and drain disturb in memory cells also largely restrict the thickness of the oxide layer during the course of size reduction of the device. Therefore, when the device size has reached its physical limit, it becomes a very urgent need to find a way other than the device size reduction to overcome the shortcomings brought by the reduced device size.

To improve the current performance in the device, there are many ways for increasing the carrier mobility. One of these ways is the already known strained Si channel approach, in which stressed Si channel is formed. The stress is helpful in increasing the mobility of electrons or holes, so that the characteristics of MOS device may be improved via the stressed channel. The application of stress is also beneficiary to the reduction of the gate disturb and drain disturb in memory cells. That is, a relatively higher drain current may be obtained while a relatively lower drain voltage is used. Therefore, only a lowered drain voltage is needed to achieve the initially required drain current to thereby enable reduced the gate and drain disturb.

The increase of stress may be achieved by the formation of a stressed layer on the MOS device. A contact etch stop layer (CESL) may serve as the stressed layer. In depositing the stressed layer, an in-planar stress is yielded to result in energy band separation. Please refer to FIG. 7 that describes the relation between the stress direction and the energy band in a MOS semiconductor. That is, there is a rising energy band at the fourfold degenerate ($\Delta 4$) energy valley corresponding to the $k_x$ and $k_y$ directions in the space k, and a lowering energy band at the twofold degenerate ($\Delta 2$) energy valley corresponding to the $k_z$ direction in the space k. Therefore, most of the electrons are distributed in the $\Delta 2$ energy valley having lower energy band (i.e., having lower effective mass). In addition, a strain-induced band splitting, in the one hand, reduces the inter-valley scattering rate (or optical phonon scattering rate), and, on the other hand, reduces the effective density of state in the conduction band to thereby reduce the intra-valley scattering rate (or acoustic phonon scattering rate). Therefore, the lowered effective mass and scattering rate is helpful in improving the electron mobility. Similarly, the separated energy-degenerate light-hole band and heavy-hole band in the valence band as well as the lowered inter-band and the intra-band scattering rate are also enable the hole mobility improved. However, an overly thick stressed layer would lead to difficulty in subsequent gap filling, while an overly thin stressed layer would lead to limited the stress effect.

It is therefore very important to enhance the device characteristics through improvement in the stressed layer and other arrangements related thereto without complex design of the device.

SUMMARY OF THE INVENTION

A primary object of the present invention is to provide a Semiconductor memory structure with stress regions to improve the carrier mobility.

To achieve the above and other objects, the Semiconductor memory structure with stressed regions according to the present invention is a flash memory structure including a substrate defining a first device zone and a second device zone thereon; a first and a second stressed region being formed in each of the first and the second device zone to yield stress different in level; a barrier plug being formed between the first and the second device zone to separate the two device zones from each other; and a plurality of oxide spacers being located between the first stress regions and the barrier plug while in direct contact with the first stress regions.

In an embodiment of the present invention, each of the first stress regions includes a pair of L-shaped spacers facing away from each other, and each of the second stress regions is a contact etch stop layer (CESL). The stress yielded at the second stress regions is larger than that yielded at the first stress regions, and the yielded stress is a uniaxial tensile stress.

In an embodiment of the present invention, the substrate is a silicon substrate with an N-channel formed along the direction <110>.

In another embodiment of the present invention, the substrate is a silicon substrate with a channel formed along direction <100>.

In another embodiment of the present invention, each of the first device zone and the second device zone includes a gate with a drain being formed between the first and the second device zone, and a salicide layer being formed on a top of each of the gates and the drain.

With the above arrangements, the Semiconductor memory structure with stress regions according to the present invention is able to yield appropriate stress and accordingly has enhanced carrier mobility. Moreover, with the oxide spacers, the Semiconductor memory structure is protected during the formation of the salicide layer on the drain.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
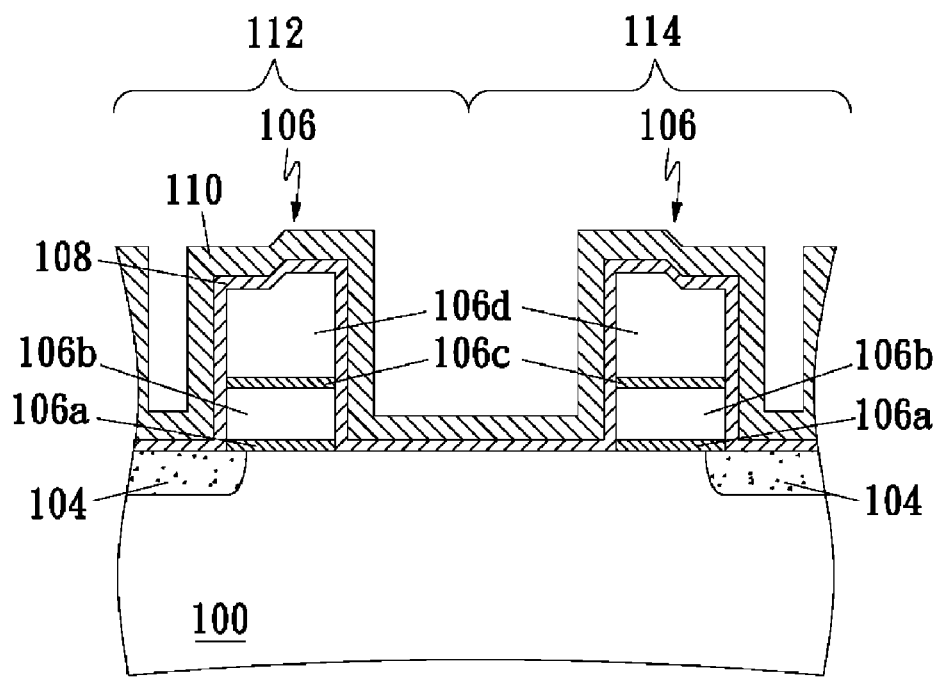
FIGS. 1 through 6 are sectional views showing a wafer in different process steps for forming a Semiconductor memory structure of the present invention.

A Semiconductor memory structure with stress regions according to a preferred embodiment of the present invention will now be described with reference to the accompanying drawings. For the purpose of clarity and easy to understand, elements that are the same in the drawings and the illustrated embodiments are denoted by the same reference numeral.

Please refer to FIG. 1 that is a sectional view of a wafer for forming the present invention. As shown, the wafer includes a semiconductor substrate 100, on which a first device zone 112 and a second device zone 114 are defined. The first and the second device zone 112, 114 may be N-channel devices, P-channel devices, or a combination thereof. In the illustrated embodiment of the present invention, the first and second device zones 112, 114 are N-channel devices. In each of the first and the second device zone 112, 114 on the semiconductor substrate 100, there are formed a source 104, a gate 106, a tunneling oxide layer 106a, a floating gate 106b, a dielectric layer 106c, a control gate 106d, a first oxide layer 108, and a second oxide layer 110. The material for the substrate 100 may be silicon, silicon-germanium (SiGe), silicon on insulator (SOI), silicon germanium on insulator (SGOI), or germanium on insulator (GOI). In the illustrated embodiment of the present invention, the substrate 100 is a silicon substrate having a crystal orientation (100) and a channel formed along a direction <110>. The second oxide layer 110 may be silicon nitride (SiN), silicon oxynitride (SiON), silicon oxide, etc. In the illustrated embodiment of the present invention, the second oxide layer 110 is SiN.

Figure 2:
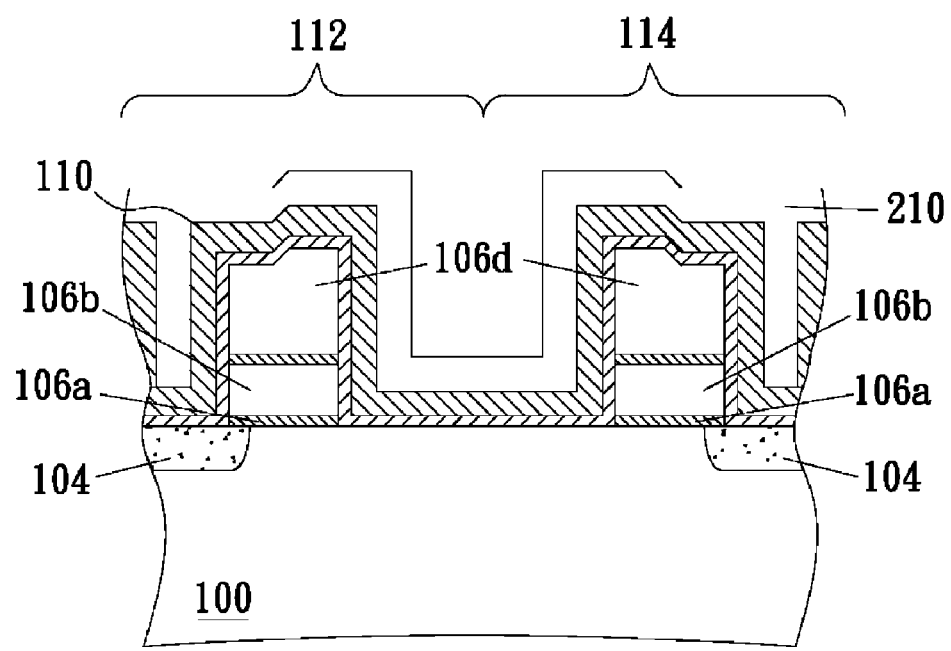
Figure 3:
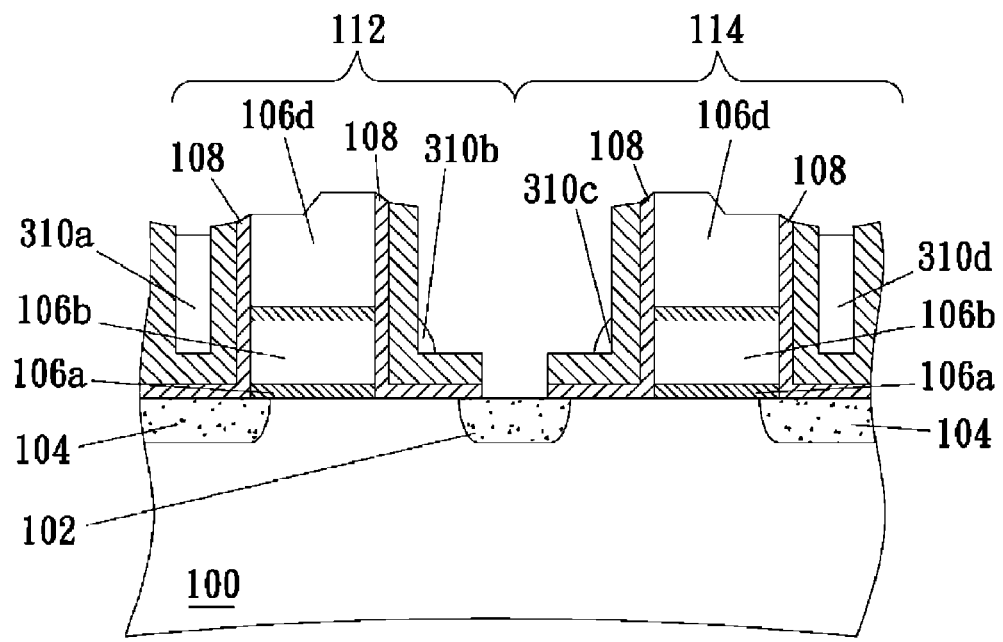

Please refer to FIG. 2. An oxide layer 210 is deposited on the substrate 100 through a known deposition technique, such as the chemical vapor deposition (CVD) process with ammonia ($NH_3$) and silane or silicon hydride ($SiH_4$) used as source gas, the rapid thermal chemical vapor deposition (RTCVD) process, or the atomic layer deposition (ALD) process. The oxide layer 210 has a thickness about 200☐ to 1500☐. In the illustrated embodiment of the present invention, the thickness of the oxide layer 210 is 750☐. The second oxide layer 110 and the oxide layer 210 at lateral sides of the floating gates 106b and the control gates 106d have a total deposition thickness "c" and at least larger than one half of the width d of an area 107 between the first and the second device zone 112, 114, so as to seal the area 107. Then, the oxide layer 210 is etched to form a plurality of oxide spacers 310a, 310b, 310c, and 310d, as shown in FIG. 3. And, the oxide layers 110, 210 atop the control gates 106d are completely removed through etching, as shown in FIG. 3. Finally, a drain 102 is formed through ion implantation. In the illustrated preferred embodiment, the oxide spacers 310b, 310c have a thickness of about 10☐ to 150☐.

Figure 4:
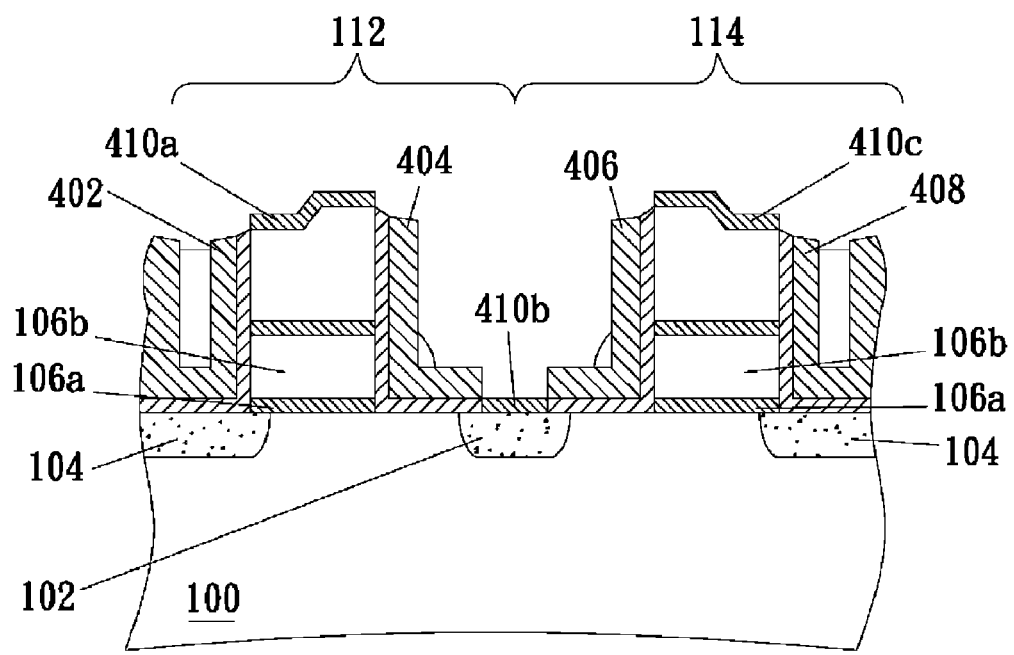

Please refer to FIG. 4. After the second oxide layers 110 atop the control gates 106d are etched away, the remained portions of the second oxide layers 110 form a first, a second, a third, and a fourth L-shaped spacer 402, 404, 406, and 408. Wherein, the first and the third spacer 402, 406 are laterally reversed L-shaped spacers. These spacers are paired, so that each pair of these spacers includes an L-shaped spacer and a sideward reverse L-shaped spacer facing away from each other. More specifically, the first and the second L-shaped spacers 402, 404 form one pair, and the third and the fourth L-shaped spacers 406, 408 form another pair. The L-shaped spacer pairs 402, 404 and 406, 408 form a first stress region in the first and second device zones 112, 114 respectively to yield a required uniaxial tensile stress for the Semiconductor memory structure of the present invention. This uniaxial tensile stress may be adjusted through proper material selection and forming process. In the forming process, there are some adjustable process parameters, including temperature, deposition speed, power, etc. One of ordinary skills in the art can easily find the relation between these process parameters and the deposition layer stress.

Then, a metal silicide layer consisting of cobalt (Co), titanium (Ti), nickel (Ni), or molybdenum (Mo) is formed on the substrate 100, and a rapid thermal treatment process is conducted, so that a salicide layer 410a, 410c is formed on a top surface of each of the gates 106 and a salicide layer 410b is formed on a top of the drain 102 to reduce the parasitic resistance and increase the device driving force.

Figure 5:
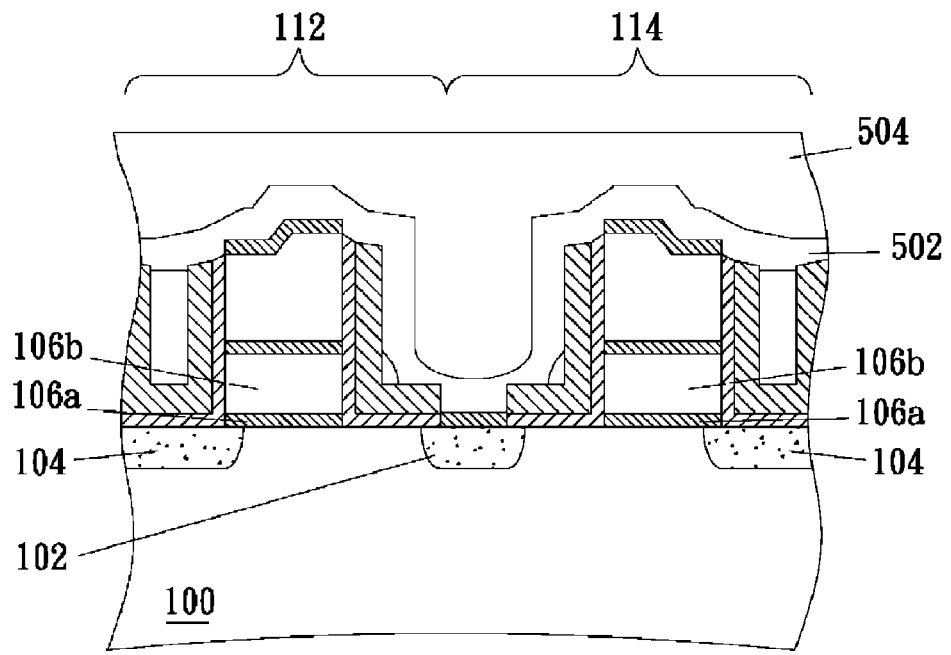

Please refer to FIG. 5. After the forming of the salicide layers 410a, 410b, 410c, a contact etch stop layer (CESL) 502 is deposited on the semiconductor substrate 100. The CESL 502 may be SiN, silicon oxynitride, or silicon oxide. In the illustrated embodiment of the present invention, the CESL 502 is SiN. The CESL 502 may have a deposition thickness about 100☐ to 1500☐. In the illustrated embodiment, through the deposition process, the CESL 502 forms a second stress region in the present invention to yield a required uniaxial tensile stress for the Semiconductor memory structure of the present invention. Wherein, the increment of stress is in relation to the numbers of the hydrogen atoms contained in the CESL 502. The lower the contained numbers of hydrogen atoms is, the higher the stress increment is. In the illustrated embodiment, the uniaxial tensile stress yielded at the L-shaped spacers 402, 404, 406, 408 is smaller than that yielded at the CESL 502. Thereafter, an inter-layer dielectric (ILD) 504, such as $SiO_2$, is deposited on the CESL 502.

Figure 6:
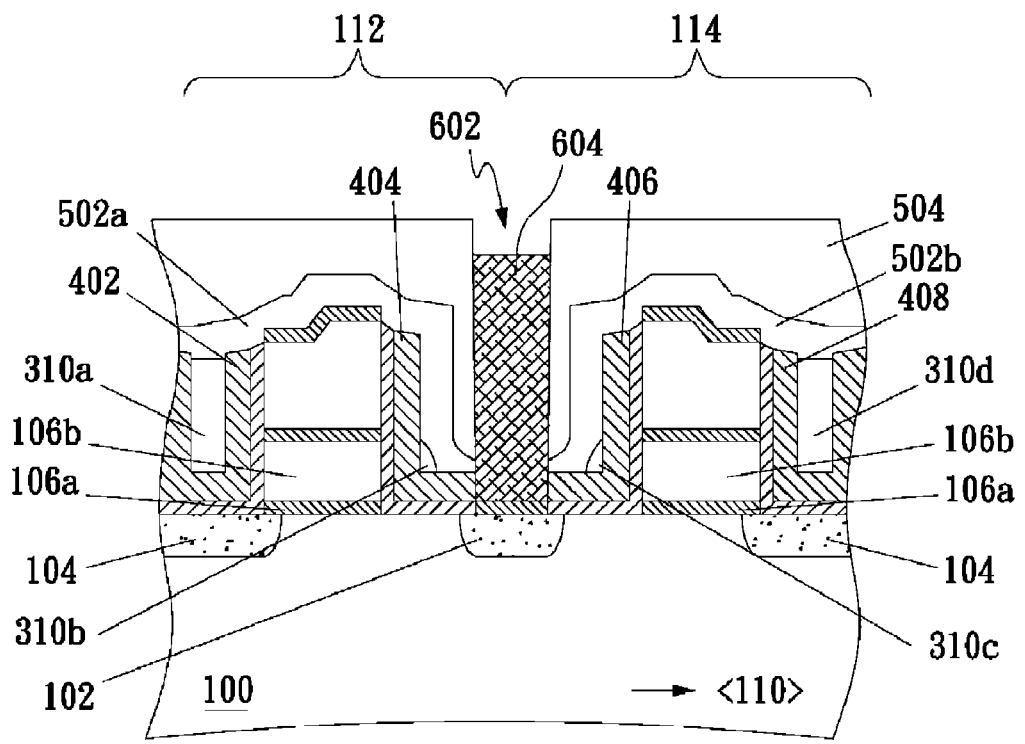
Figure 7:
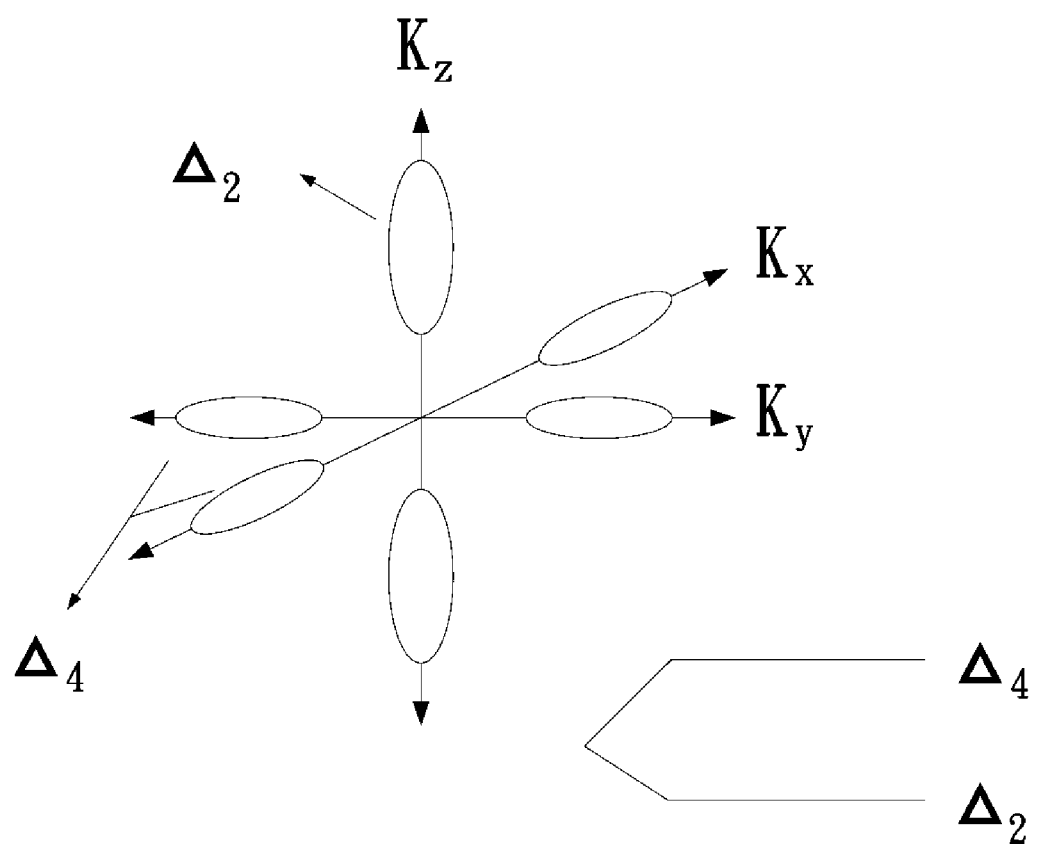
FIG. 7 describes the relation between the stress direction and the energy band in a Semiconductor memory.

Please refer to FIG. 6. After the deposition of the ILD 504, a known photoresist and mask process is conducted, so that a contact 602 is formed by anisotropic etching from the inter-layer dielectric 504 into the CESL 502. Further, a barrier plug 604 is deposited in the contact 602 using a CVD process, so that the CESL 502 is split into two parts 502a and 502b. It is noted the oxide spacers in each of the first and second device zones 112, 114 (i.e., the oxide spacers 310a, 310b in the first device zone 112 and the oxide spacers 310c, 310d in the second device zone 114) are asymmetrical.

In the above-described embodiment, there are formed two stress regions, namely, a first stress region consisting of the L-shaped spacer pair 402, 404/406, 408, and a second stress region consisting of the split contact etch stop layer 502a/502b in each of the first and the second device zone 112, 114. Wherein, all the L-shaped spacers 402, 404, 406, 408 and the contact etch stop layers 502a, 502b are subjected to rapid thermal treatment in different process steps to yield an appropriate uniaxial tensile stress, so as to increase effective mass of the electrons and thereby reduce the tunneling leakage current. As a result, it is possible to decrease the thickness of the tunneling oxide layers 106a and reduce the occurrence of short channel effect (SCE) while the condition of stress-induced leakage current (SILC) is unchanged.

In the illustrated embodiment of the present invention, the uniaxial tensile stress yielded at the L-shaped spacers 402, 404, 406, 408 is smaller than that yielded at the CESL 502a, 502b. Moreover, since the substrate 100 has a crystal orientation (100) and a channel formed along the direction <110>, these features together with the uniaxial tensile stress yielded at the stress regions make the memory device produced from the Semiconductor memory structure of the present invention has increased electron mobility, which is helpful in increasing the reading current. That is, it is possible to achieve an initially desired reading current with only a lowered reading voltage to thereby have upgraded the data retention ability.

In another embodiment of the present invention, the substrate 100 has a crystal orientation (100) and a channel formed along the direction <100>. Compared to the substrate 100 having channel formed along the direction <110>, electrons in channel formed along the direction <100> have a relatively higher piezoresistance coefficient. Therefore, the uniaxial tensile stress yielded at the stress regions formed in this embodiment is able to further increase the electron mobility in the memory device. In addition, due to the lattice direction <100>, the hole mobility in a P-channel metal-oxide-semiconductor (PMOS) would not become reduced.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A semiconductor memory structure with stress regions, comprising:
    a substrate defining a first device zone and a second device zone thereon;
    a first stress region and a second stress region being formed in each of the first device zone and the second device zone, and the stress yielded at the first stress regions and at the second stress regions being different in level;
    a barrier plug being formed between the first device zone and the second device zone to separate the two device zones from each other; and
    a plurality of oxide spacers being located between the first stress regions and the barrier plug while in direct contact with the first stress regions.

2. The semiconductor memory structure with stress regions as claimed in claim 1, wherein the substrate is a silicon substrate with a channel formed along a direction <110>.

3. The semiconductor memory structure with stress regions as claimed in claim 2, wherein the channel is an N-channel.

4. The semiconductor memory structure with stress regions as claimed in claim 1, wherein the substrate is a silicon substrate with a channel formed along a direction <100>.

5. The semiconductor memory structure with stress regions as claimed in claim 1, wherein the oxide spacers are selected from the group consisting of SiN, silicon oxynitride, and silicon oxide.

6. The semiconductor memory structure with stress regions as claimed in claim 1, wherein the first stress region in each of the first and second device zones includes a pair of L-shaped spacers facing away from each other.

7. The semiconductor memory structure with stress regions as claimed in claim 6, wherein the L-shaped spacers are selected from the group consisting of SiN, silicon oxynitride, and silicon oxide.

8. The semiconductor memory structure with stress regions as claimed in claim 1, wherein the second stress region in each of the first and second device zones is a contact etch stop layer (CESL).

9. The semiconductor memory structure with stress regions as claimed in claim 8, wherein the contact etch stop layer is selected from the group consisting of SiN, silicon oxynitride, and silicon oxide.

10. The semiconductor memory structure with stress regions as claimed in claim 1, wherein the stress yielded at the first stress regions is smaller than the stress yielded at the second stress regions.

11. The semiconductor memory structure with stress regions as claimed in claim 10, wherein the yielded stress is a uniaxial tensile stress.

12. The semiconductor memory structure with stress regions as claimed in claim 1, wherein each of the first device zone and the second device zone includes a gate with a drain being formed between the first and the second device zone.

13. The semiconductor memory structure with stress regions as claimed in claim 12, wherein a salicide layer is formed on a top of each of the gates and the drain.

14. The semiconductor memory structure with stress regions as claimed in claim 1, wherein the plurality of oxide spacers have a thickness ranged about 10 Å to 150 Å.

15. The semiconductor memory structure with stress regions as claimed in claim 1, wherein each of the plurality of oxide spacers is positioned between the first stress region and the barrier plug, while being in direct contact with both the first stress region and the second stress region.

16. The semiconductor memory structure with stress regions as claimed in claim 1, wherein the plurality of oxide spacers is not in direct contact with the barrier plug.

17. The semiconductor memory structure with stress regions as claimed in claim 12, wherein the first stress region in each of the first and second device zones is formed beside the gate, and the second stress region in each of the first and second device zones is formed above and beside the gate.

* * * * *